United States Patent [19]

Wang et al.

[11] Patent Number: 4,521,765

[45] Date of Patent: Jun. 4, 1985

[54] CIRCUIT AND METHOD FOR REDUCING NON-LINEARITY IN ANALOG OUTPUT CURRENT DUE TO WASTE CURRENT SWITCHING

[75] Inventors: Anthony D. Wang; Donald L. Brumbaugh, both of Tucson, Ariz.

[73] Assignee: Burr-Brown Corporation, Tucson, Ariz.

[21] Appl. No.: 491,600

[22] Filed: May 4, 1983

Related U.S. Application Data

[63] Continuation-in-part of Ser. No. 421,506, Sep. 22, 1982, Pat. No. 4,468,652, which is a continuation of Ser. No. 250,867, Apr. 3, 1981, abandoned.

[51] Int. Cl.³ .............................................. H03K 13/02
[52] U.S. Cl. ............................................... 340/347 DA
[58] Field of Search ................................... 340/347 DA

[56] References Cited

U.S. PATENT DOCUMENTS

| | | | |
|---|---|---|---|
| 3,842,412 | 10/1974 | Spofford, Jr. | 340/347 DA |
| 3,932,863 | 1/1976 | Pastoriza | 340/347 DA |
| 4,250,492 | 2/1981 | Yamakido | 340/347 DA |
| 4,338,590 | 7/1982 | Connolly, Jr. et al. | 340/347 DA X |
| 4,381,499 | 4/1983 | Struthoff | 340/347 DA |
| 4,414,641 | 11/1983 | Jarrett | 340/347 DA |
| 4,468,607 | 8/1984 | Tanaka et al. | 340/347 DA |
| 4,468,652 | 8/1984 | Wang et al. | 340/347 DA |
| 4,482,887 | 11/1984 | Crauwels | 340/347 DA |

*Primary Examiner*—B. Dobeck
*Attorney, Agent, or Firm*—Cahill, Sutton & Thomas

[57] ABSTRACT

An integrated circuit digital to analog converter includes circuitry having first and second resistors in a R/2R resistor ladder which scales bit current contributions to an analog output current. Each of the first and second resistors have a respective terminal connected to the collector of a bit current transistor, the emitter of which is connected to the emitter of a waste current transistor. The digital to analog converter includes a metal ground voltage conductor having a "shared node" and a distributed resistance between one side of the shared node and a main ground voltage connection. The collector of the waste current transistor and a second terminal of the first resistor are both connected directly to the shared node. In operation, the waste current transistor switches waste current into the shared node, rather than into a separate waste current ground conductor. This results in substantially less voltage variation across the distributed resistance of the metal ground voltage conductor, and consequently lower non-linearity, than is the case if waste current is switched into the separate ground conductor.

13 Claims, 6 Drawing Figures

FIG_3

(ALL BITS ON)
Fig. 5A (ALL BITS OFF)
Fig. 5B

CIRCUIT AND METHOD FOR REDUCING NON-LINEARITY IN ANALOG OUTPUT CURRENT DUE TO WASTE CURRENT SWITCHING

CROSS-REFERENCE TO RELATED APPLICATIONS

This is a continuation-in-part of our pending application Ser. No. 421,506, filed Sept. 22, 1982, now U.S. Pat. No. 4,468,652, which is a continuation of our application entitled "Digital-to-Analog Converter Having Ladder Network and Improved Interconnection Therefor" Ser. No. 250,867, filed April 3, 1981, now abandoned. The foregoing parent application, Ser. No. 421,506, is incorporated herein by reference.

BACKGROUND OF THE INVENTION

The invention relates to apparatus and methods for converting digital words into corresponding analog output signals, especially to circuits and methods for minimizing non-linearity in such analog output signals due to variations in voltages across ground conductor resistances, which variations are caused by changes in the digital words.

Monolithic digital to analog converter circuits are well known in the art and typically include a plurality of bit switches, each responsive to a particular bit within an input digital word to selectively steer an associated "bit switch current" to a summing node in a resistor ladder network in order to make a contribution to an analog output current. The resistive ladder networks usually "scale" contributions of the various bit switch currents in a binarily weighted fashion when the corresponding bit switches are "on", i.e., "active". The contribution of each active bit switch current is progressively halved, starting with the most significant bit switch and moving toward the least significant "active" bit switch. In a typical prior art structure, the resistor network is an "R/2R network" in which a first thin, aluminum metalization line (referred to herein as a ground conductor) conducts a ground current to one end of half of the resistors, the other end of each of those resistors being connected to the collector of a respective NPN "bit switch transistor" (also referred to herein as a "bit current transistor"). The distributed resistance of the ground conductor is very small compared to the resistance of the ladder network resistors, but nevertheless is finite. The other resistors of the R/2R network are connected between respective pairs of adjacent bit switch transistors. Each of the bit switch transistors is paired in a common emitter configuration with a corresponding "waste current transistor", the collector of which is connected to a second common ground current conductor referred to herein as a "waste current conductor". Thus, if a particular bit is "active", the corresponding bit current is switched through the resistive ladder network, and a portion of that bit current flows through the distributed resistance of the first ground conductor. However, if that bit is "inactive" or off, then the entire bit switch current (now referred to as the "waste current" for that bit) is steered through the corresponding waste current transistor and into the waste current ground conductor. In this event, none of the bit switch current flows through the distributed resistance of the first ground conductor.

If the distributed resistance of the first ground conductor is appreciable, the variation in voltage across the resistance of the first ground conductor (as various bits are switched on or off) causes errors that are referred to as "non-linearity" errors. (Non-linearity errors can be graphically represented by the deviation from a straight line of the average of the value of the analog output current plotted versus the numerical value of the digital input word).

Those skilled in the art have long been aware of the existence of non-linearity errors caused by bit current switching. The non-linearity errors are due to the above-mentioned variation in voltage drops across the distributed resistance of the first ground conductor and various other causes, including self heating of resistors and thermal interaction between devices in the chip. The portion of the non-linearity due to inaccurate splitting of the various bit currents switched into the ladder network can be compensated, for example, by state-of-the art laser trimming techniques, to adjust the values of the ladder network resistors (which are usually composed of nichrome). However, the portion of the non-linearity errors due to the above-mentioned voltage variations across the distributed resistance of the first ground conductor cannot be eliminated by trimming of the ladder network resistors. To the extent that past attempts have been made to reduce such voltage variations, the reductions have been accomplished by simply making the first ground conductor metal line wider, thereby reducing its resistance. Typically, the resistance of integrated circuit metal conductors may be only approximately 0.026 ohms per square, whereas the ladder resistors may vary from 100 ohms for a high speed digital to analog converter to several thousand ohms per square for a slow speed digital to analog converter. For digital to analog converters with eight-bit accuracy, the non-linearities due to resistance of the first ground conductor generally have been sufficiently narrow that they have been ignored. However, for higher accuracy digital to analog converters, such as a twelve bit digital to analog converters, the linearity errors caused by the voltage variations (due to bit pattern switching) across the distributed resistance of the first metal conductor can be a very significant source of non-linearity errors. To our knowledge, no one has previously suggested a practical solution (other than simply expanding the width of the first ground conductor) for reducing non-linearity errors caused by voltage drops across the first ground conductor, which voltage drops are caused by variations in the input word.

The integrated circuit layout structure of prior art digital to analog converter circuits generally includes a resistive ladder network positioned on a portion of the integrated circuit surface. The bit switch current transistors are respectively formed in separate electrically isolated N type regions adjacent to the resistor ladder nodes into which the respective bit currents are to be switched when the various bits are active. The waste current transistors typically are all disposed in a single, elongated isolated N type region located on the side of the bit switch transistors opposite to the resistor ladder. This can be done since all of the collectors of the waste current transistors are connected to the same waste current conductor. Portions along the entire length of this common collector region are shorted to the metal waste current conductor, which is connected to a main ground voltage conductor (such as bonding pad) on the integrated circuit substrate. This is a very efficient topography.

Those skilled in the art know that the yield, and hence the cost of an integrated circuit is highly dependent upon the chip size. The above described layout structure, with all of the waste current transistors sharing only a single isolated N type region, is very efficient in use of chip area. Therefore, the technique of minimizing the above-mentioned bit pattern variations in the voltage drop across the first conductor resistance by simply widening the first conductor to reduce its resistance would generally be thought by those skilled in the art to be more desireable than making changes in circuitry if such changes which would require each of the waste current transistors to be formed in a separate isolated N type region.

Nevertheless, we have found that as the complexity and required accuracy of a digital to analog converter circuit increases, adequately increasing the width of the first metal conductor to reduce non-linearity errors due to waste current switching to provide sufficient accuracy may excessively increase the amount of chip area required.

Therefore, it is an object of the invention to provide a circuit and method for reducing bit-pattern-sensitive non-linearities caused by distributed resistance of a ground voltage conductor in a resistive ladder of a digital to analog converter circuit.

SUMMARY OF THE INVENTION

Briefly described, and in accordance with one embodiment thereof, the invention provides an improved circuit and method for converting a digital input word to an analog output current in such a manner as to substantially reduce non-linearity errors caused by variation in voltage across the distributed resistance of a metal reference voltage conductor, which variations are caused by changes in the value of the digital word. The reduction of the reference voltage variations is accomplished by switching the waste currents for each particular bit into respective corresponding "shared" nodes of the reference voltage conductor. Each shared node is also connected to one terminal of a resistor in a resistor ladder network that binarily scales contributions of a plurality of bit currents, which contributions are summed to produce the total analog output current. In operation, if a particular bit is "active", a portion of the corresponding bit current flows through the distributed resistance of the reference current conductor. However, if the bit is "inactive" then all of the bit current (which then is referred to as the waste current for that particular bit), is switched into the corresponding shared node so that the waste current flows through the distributed resistance of the reference voltage conductor. Although the portion of the corresponding bit current flowing through the distributed resistance is always less than the bit current itself, the voltage variation across the distributed resistance caused when the subject bit changes state nevertheless is substantially less than would be the case if the waste current were to be switched into a separate ground conductor. Therefore, the above described non-linearity errors caused in response to variations in the value of the digital word are substantially reduced.

In the described embodiment of the invention a typical "bit circuit" includes a portion of an R/2R resistor ladder network, a first resistor of which has a first terminal connected to the shared node of a first metal ground conductor on an integrated circuit substrate. The second terminal of that resistor is connected to the collector of an NPN bit current transistor, as well as to other resistors. The emitter of the bit current transistor is connected directly to the emitter of a waste current NPN transistor and also to a constant bit current circuit. The collector of the waste current transistor is directly connected to the same shared node as the first terminal of the first resistor. The shared node is sufficiently small in area that resistance between the connecting points of the first terminal of the first resistor and the connecting point of the collector of the waste current transistor is negligible compared to the distributed resistance of the ground voltage conductor to either the adjacent bit circuit or to a substantially zero resistance main ground voltage connection point. The collector of each bit current transistor is coupled by means of a second resistor of the ladder network to the collector of at least one adjacent substantially similar "bit circuit". Our analysis has showed that the main ground voltage connection point should be connected to the ground reference conductor at the point nearest the most significant bit end of the ground reference conductor in order to minimize the maximum possible variation in the voltage of any point of the first ground voltage conductor caused by switching the corresponding bit of the digital word from a logical "1" to a logical "0".

In the described embodiment of the invention, the foregoing shared node connections to the corresponding waste current transistors are utilized in the portion of the digital to analog converter utilizing the resistive ladder to "scale" bit current contributions to the analog output current. Other more significant bits of the digital to analog converter, which utilize circuit configurations other than a resistive ladder network to determine current contributions to the total analog output current, switch the waste currents directly to a second ground voltage conductor.

In the described embodiment of the invention, its topography is such that the R/2R resistive ladder network is disposed on an integrated circuit substrate on one side of the first ground voltage conductor, which consists of an aluminum metalization line. Each of the bit current transistors is an NPN transistor which is respectively disposed in a separate isolated N type region. Each of those N type isolated regions extends beneath the ground voltage conductor to make electrical contact to a respective "connection node" portion of aluminum metalization that functions as a low resistance connection node to which both of the "R" and "2R" resistors corresponding to that bit current transistor are connected. Each bit current transistor has its emitter connected directly to the emitter of a corresponding NPN waste current transistor. Each waste current transistor is disposed in a respective isolated N type region, the collector contact portion of which extends beneath the first ground voltage conductor and makes electrical contact to a respective "shared node" portion thereof. N+ type "buried layer" regions disposed on the respective bottoms of the collector regions of the bit current transistors extend beneath the first ground voltage conductor to the aluminum metalization constituting the connection node of the resistor ladder network.

DESCRIPTION OF THE INVENTION

Figure 1:
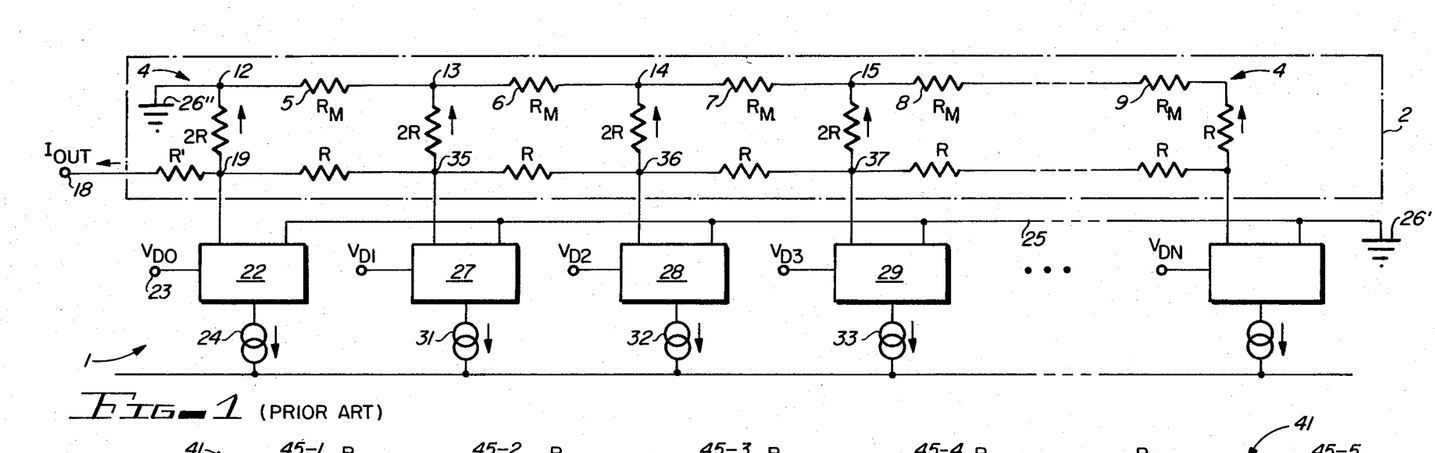
FIG. 1 is a schematic diagram useful in explaining prior art.

Referring now to FIG. 1, it will be helpful to first briefly describe the structure of a typical prior art digital to analog converter circuit that uses an R/2R ladder network. The digital to analog converter circuit 1 includes the R/2R network generally designated by reference numeral 2. The R/2R ladder network includes a ground reference conductor generally designated by numeral 4, which typically is a thin strip of aluminum metalization on an integrated circuit substrate. (Typically, the sheet resistance of ground conductor 4 is approximately 0.026 ohms per square.) The distributed resistance of ground conductor 4 has been lumped into resistors 5, 6, 7, 8 and 9 in FIG. 1. Nodes 12, 13, 14 and 15 are shown between the lumped resistors, each of which has a value $R_M$. For a ground conductor that is (for example) 1.0 mils wide, the distributed resistance is quite negligible for digital to analog converters of less than approximately eight bit accuracy. (The R/2R ladder configuration is well known to those skilled in the art, and is shown in FIG. 1, and need not be described in further detail.) The analog current output conductor 18 is connected by a generalized resistance R' to node 19. Node 19 is connected to a first switch circuit 22. Bit switch circuit 22 has an input 23 to which a voltage $V_{D0}$ representing the state of a bit D0 of a digital input word D0, D1, D2 ... DN is applied. Bit switch circuit 22 steers a constant current from current source 24 through either node 19 or waste current conductor 25. Waste current conductor 25 is connected to a main ground voltage connection 26'. Ground conductor 4 is connected to a second main ground connection 26", and is at the same potential as ground connection 26' or is within a few millivolts thereof.

Similarly, bit switch circuits 27, 28 and 29 are responsive to bit voltages $V_{D1}$, $V_{D2}$, $V_{D3}$, respectively, to steer constant currents from current sources 31, 32 and 33 into appropriate nodes 35, 36 and 37, respectively, if the voltages $V_{D1}$, $V_{D2}$ and $V_{D3}$ are logical "one's". Each of the bit switch circuits 22, 27, 28 and 29 operates to switch the respective constant currents into waste current conductor 25 if the respective input voltages are equal to logical "zero's".

Thus, it can be seen that if all of the digital input voltages $V_{D0}$, $V_{D1}$ ... are equal to logical "zero's" all of the constant currents are switched into waste current conductor 25, and none of them are switched into ladder network 2. In this event none of the source currents flow through the distributed metal resistances 5, 6, 7, 8, etc.

Next, consider the case wherein all of the voltages $V_{D0}$, $V_{D1}$, etc., are logical "one's". In this case, it can be shown that all of the source currents are switched into R/2R ladder network 2, and it can be further shown that most of this current flows through the various metal line $R_M$ resistances. The resulting variations in voltages across the distributed $R_M$ resistances are the cause of the previously described non-linearity errors.

A rigorous analysis will show that the voltage variation across each of the $R_M$ resistances, 5, 6, 7, etc., that occurs in response to changes in the digital input word becomes significant as the number of bits of the digital to analog converter increases much beyond eight bits. As previously mentioned, these non-linearities cannot be adequately compensated for by precise trimming of the resistors in ladder network 2.

With this background information in mind, the circuit of the present invention now will be described with reference to FIG. 2. Digital to analog converter 40 of FIG. 2 includes an R/2R resistor ladder network (which is identical to the one of FIG. 1) including a ground voltage conductor generally designated by numeral 41 and having distributed metal ground conductor resistances that are shown in the circuit schematic of FIG. 2 as a plurality of "lumped" resistances 43-1, 43-2, 43-3, etc. Each lumped resistance has a resistance $R_M$. Between each of the $R_M$ resistances is a portion of ground voltage conductor 41 that is hereinafter referred to as a "shared node". These shared nodes are designated by reference numerals 45-1, 45-2, 45-3, etc. The resistance of the metalization of the conductor 41 contained within each shared node is negligible compared to the resistance $R_M$.

Metal resistance 43-1 is connected between shared nodes 45-1 and 45-2. Metal resistance 43-2 is connected between shared nodes 45-2 and 45-3. Similarly, metal resistance 43-3 is connected between shared nodes 45-3 and 45-4.

Resistors 47-1, 47-2, 47-3, 47-4 and 47-5 have values 2R, 2R, 2R, 2R and R, respectively. Resistors 48-1, 48-2, 48-3, 48-4 and 48-5 each have resistance R. Resistor 47-1 is connected between node 45-1 and node 50. Resistor 47-2 is connected between node 45-2 and node 51. Resistor 47-3 is connected between node 45-3 and node 52. Resistor 47-4 is connected between node 45-4 and node 53. Resistor 47-5 is connected between node 41 and node 54. Resistor 48-1 is connected between nodes 50 and 51. Resistor 48-2 is connected between nodes 51 and 52. Resistor 48-3 is connected between nodes 52 and 53. The structure continues similarly in the manner indicated by dotted lines 56.

In digital to analog converter circuit 40, NPN transistors 60-1, 60-2, 60-3, 60-4 and 60-5 have their collectors connected to conductors 50, 51, 52, 53 and 54, respectively. NPN waste current transistors 61-1, 61-2, 61-3, 61-4 and 61 have their collectors connected directly to shared nodes 45-1, 45-2, 45-3, and 45-5, respectively. The emitters of transistors 60-1 and 61-1 are connected together and to a constant current source circuit 63-1. Similarly, the emitters of bit current transistors 60-2 and 61-2 are connected to constant current source 63-2. Constant current source circuit 63-3 is connected to the emitters of transistors 60-3 and 61-3. Current source circuits 63-4 and 63-5 are similarly connected to the other two illustrated emitter-coupled transistor pairs. The bases of each of waste current transistors 61-1, 61-2, 61-3, etc., have applied thereto a reference voltage $V_R$ that lies midway between the high and low levels of the digital input voltages $V_{D0}$, $V_{D1}$, $V_{D2}$, etc., that are applied, respectively, to the bases of each of bit current transistors 60-1, 60-2, 60-3, etc.

Reference numeral 65 designates the output analog current terminal through which the analog output current $I_{OUT}$ flows. One of the important distinguishing features of the improved digital to analog converter circuit 40 over the prior art circuit shown in FIG. 1 is the elimination of a separate waste current conductor such as 25 in FIG. 1 and the elimination of the direct connection thereto of the collectors of waste current transistors 61-1, 61-2, etc., to the respective shared nodes 45-1, 45-2, etc.

Figure 2:
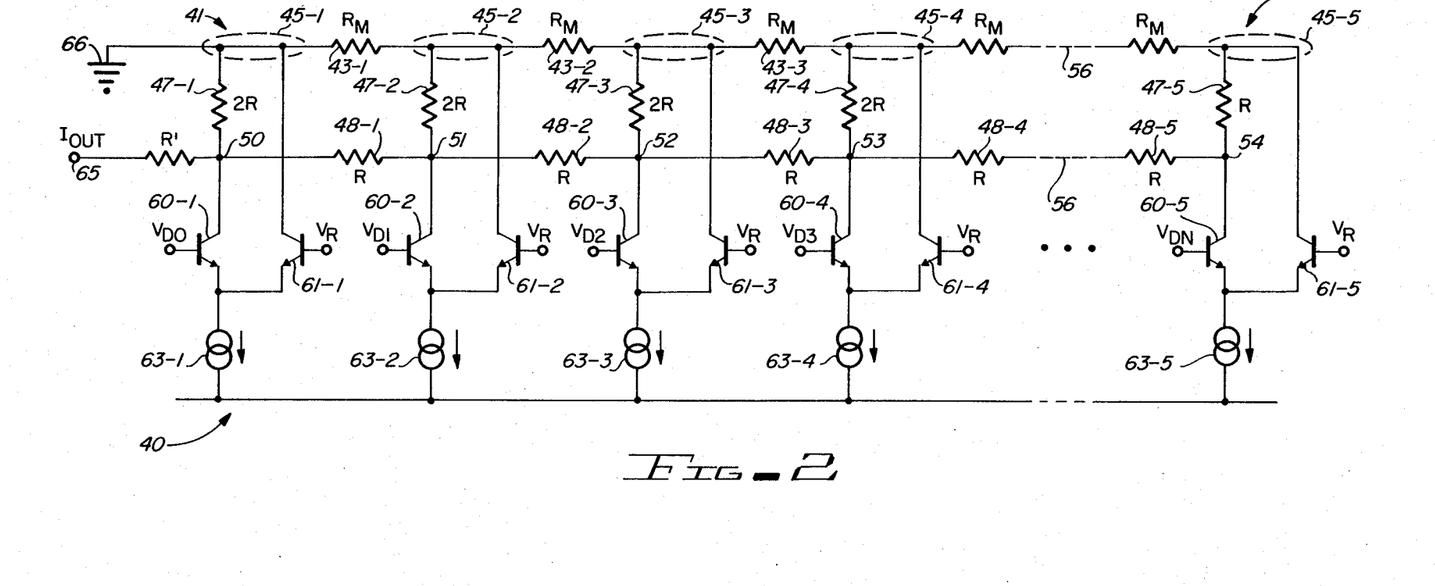
FIG. 2 is a schematic diagram of an embodiment of the invention.

The constant currents flowing through each of the constant current sources in FIG. 2 are presumed to be equal. Note that when these constant currents are steered by bit current transistors 60-1, 60-2, etc., into the nodes 50, 51, 52, etc., of the R/2R ladder network, they are referred to as "bit currents", but when the same constant currents are steered through the waste current transistors 61-1, 61-2, etc., into shared nodes 45-1, 45-2, etc., then they are referred to as "waste currents", since they no longer are operated upon by the resistive ladder network and no longer contribute to the analog output current $I_{OUT}$.

Figure 3:
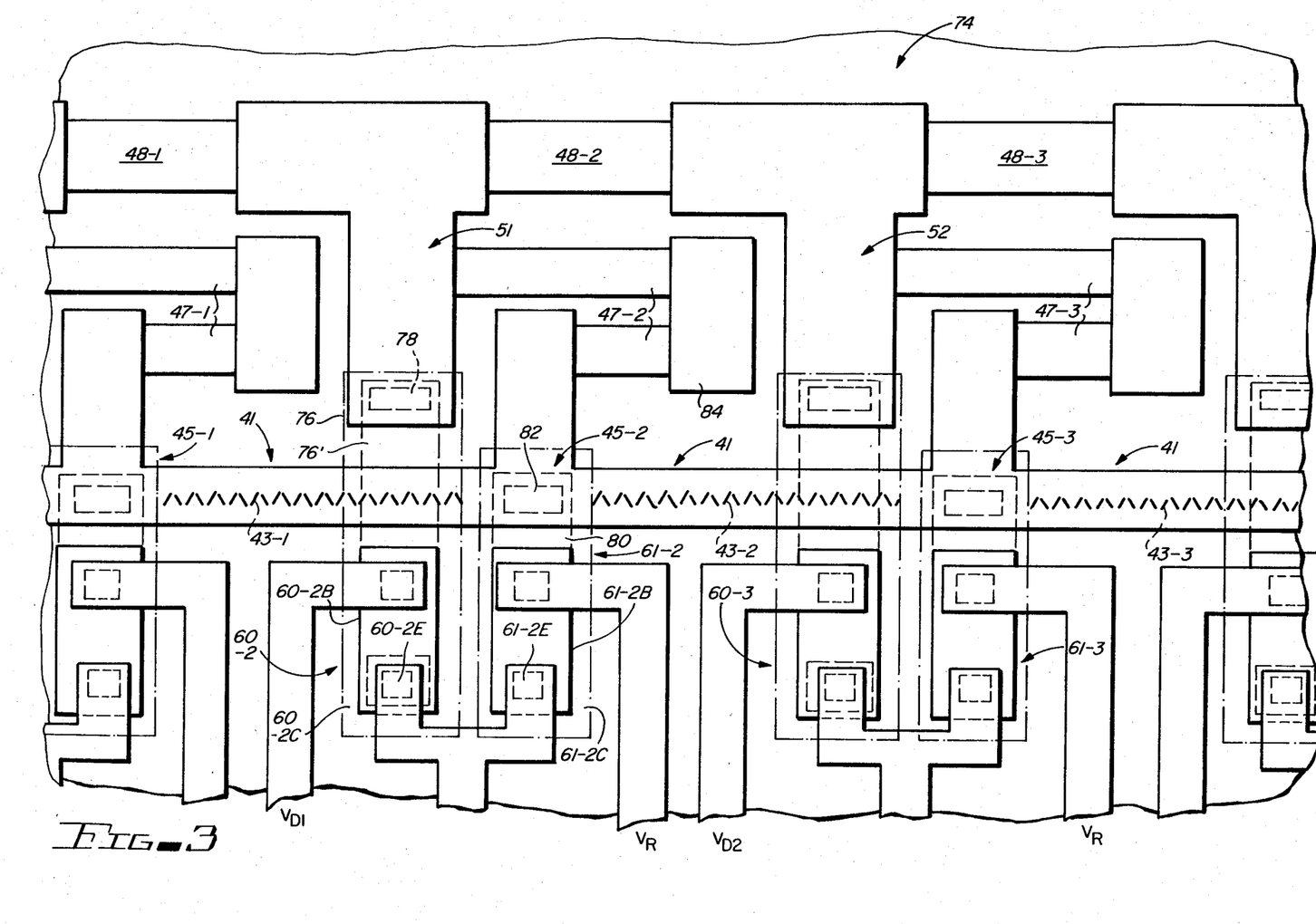
FIG. 3 is a plan view of an integrated circuit layout of a portion of the circuit shown in FIG. 2.

FIG. 3 shows a topographical view of an integrated circuit layout of a portion of the circuit in FIG. 2 including transistors 60-2, 61-2, 60-3, and 61-3 and resistors 47-2, 47-3, 48-1, 48-2, and 48-3 and ground conductor 41. Where appropriate, reference numerals similar or identical to those in FIG. 2 also are used in FIG. 3 to designate analogous or corresponding components.

However, before describing in detail the structure of the integrated circuit layout topography shown in FIG. 3 in detail, it may be helpful to explain by way of example how the technique of dumping waste current into the above described shared nodes substantially decreases linearity errors due to switching of the digital input word pattern, compared to the prior art technique of dumping all of the waste current into a separate ground conductor 25 (FIG. 1).

Figure 5A:
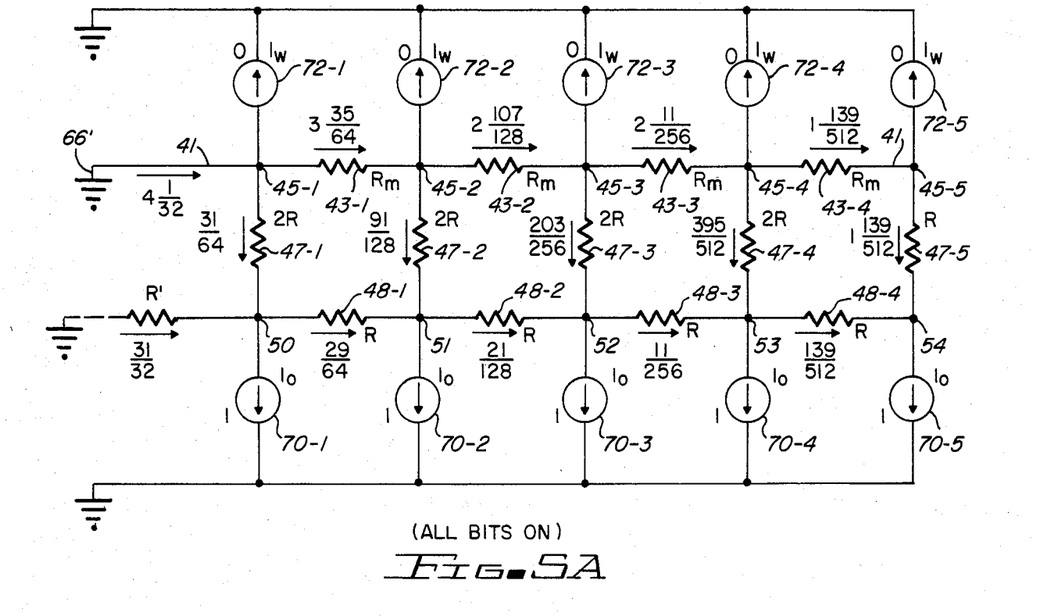
FIG. 5A and 5B are circuit diagrams useful in explaining approximately how the circuit of FIG. 2 minimizes non-linearity errors due voltage variations across ground conductor resistance, which voltage variations are caused in response to bit pattern switching.

Referring now to FIG. 5A, the current flow through the metal ground conductor 41 has been computer analyzed for a hypothetical case in which all four bits of an R/2R ladder network are "active". In other words, each of the bit current transistors are on. For simplicity of illustration, it is assumed that the lumped metal resistances 43-1, 43-2, 43-3, and 43-4 are all on one side of main ground conductor 66'. The four bit current sources 70-1, 70-2, 70-3, and 70-4 are each assumed to be feeding a one milliampere current into nodes 50, 51, 52 and 53, respectively. The foregoing current sources represent current steered into the foregoing respective nodes by means of bit current transistors such as 60-1, 60-2, etc., respectively. The waste current sources 72-1, 72-2, 72-3 and 72-4, respectively indicate that zero milliamperes flows into each of the shared nodes 45-1, 45-2 etc. The arrows in FIG. 5A indicate the directions of the currents flowing through each of the adjacent resistors. The number in parenthesis adjacent to each arrow indicates the computed number of milliamperes of current flowing through the adjacent resistor. The assumption is made that $R_M$ is equal to zero for this simplified example. Thus, it can be seen that 3-35/64 milliampere flows through metal resistance 43-1. Similarly, 2-107/128 milliamperes flow through metal resistance 43-2. 2-11/256 milliamperes flow through metal resistance 43-3 and 1-139/572 milliamperes flow through metal resistance 53-4.

Ideally, it would be desirable that the foregoing currents flowing through the RM resistors remain unchanged as the digital input word pattern is switched, because if these currents remain unchanged despite bit pattern switching, then the other resistors (i.e., the "R" and "2R" resistors) in the network can be laser trimmed to accurately compensate for the "parasitic" $R_M$ resistances. However, if the currents through the various $R_M$ resistances do vary as a function of the digital input word pattern, as the following example shows they do, then it is not possible to fully compensate for the effect of the parasitic metal resistances by laser trimming the R and 2R resistors in the ladder network.

Figure 5B:
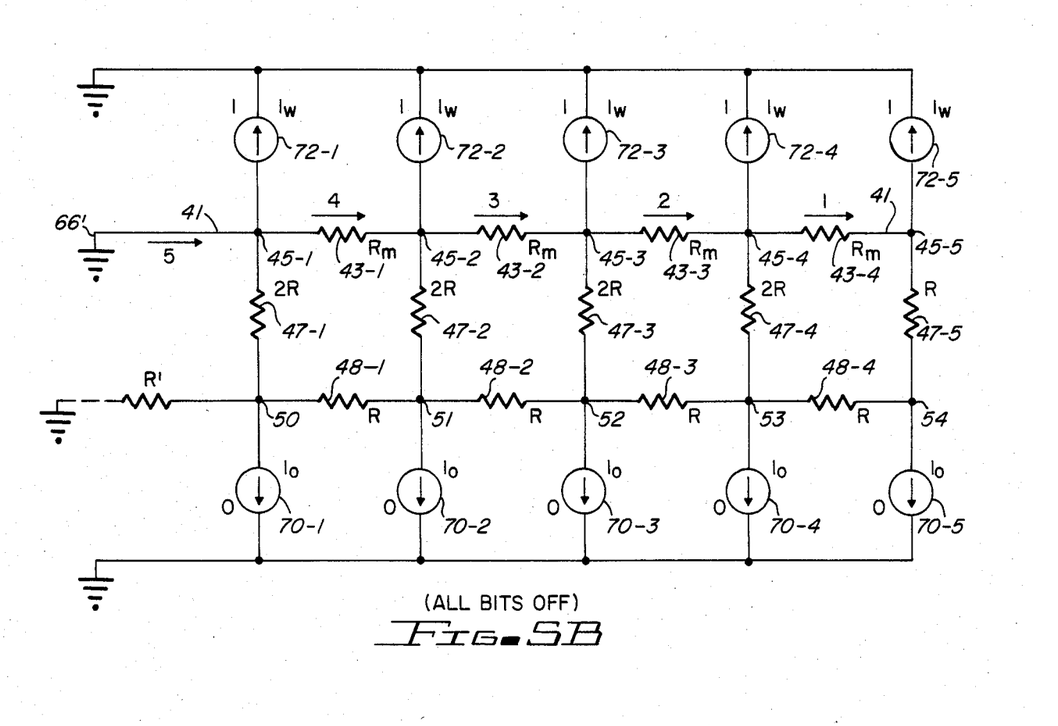

Referring now to FIG. 5B, the circuit shown in FIG. 5A is repeated, except that now the bit current sources 70-1, 70-2, etc., are all equal to zero, whereas the waste current sources 72-1, 72-2, etc., are all equal to one milliampere. This illustrates the equivalent circuit configuration for the case when all four illustrated bits are logical "zero's", i.e., "inactive". In this case, it can be readily seen that nearly all of the waste current flows through the $R_M$ resistances which present nearly zero resistance to the flow of current to ground conductor 66'. (Typically, R might be from a few hundred ohms for a high speed digital to analog converter to several kilohms for a slower digital to analog converter circuit, whereas $R_M$ is a small fraction of an ohm). It can be readily seen that 4 milliamperes flow through metal resistance 43-1, 3 milliamperes flow through metal resistance 43-2, 2 milliamperes flows through metal resistance 43-3, and 1 milliampere flow through metal resistance 43-4. Thus, it can be seen that the differences in currents through the metal $R_M$ resistances for the case when all bits are on and the case when all bits are off are 29/64 milliampere for resistance 43-1, 21/128 of a milliampere for resistance 43-2, $-245/256$ of a milliampere for metal resistance 43-3 and $-373/512$ of a milliampere for metal resistance 43-4. The resulting variations in voltage drops across each of the $R_M$ metal reistances is obtained by simply multiplying the above current differences by the respective $R_M$ resistances.

By comparing the above indicated current differences and/or voltage variations across each $R_M$ resistance for the circuit shown in FIG. 5A with the voltage variations for the prior art circuit shown in FIG. 1 (wherein the waste currents are all dumped into waste current conductor 25), it will be readily apparent that the voltage variation across each metal resistance is greatly reduced for the circuit of FIGS. 5A, B. For example, in an eight bit circuit of the kind shown in FIG. 1, the maximum voltage across the ground conductor metal resistance closest to the main ground conductor 26" could be approximately 8 milliamperes multiplied by $R_M$ ohms if all eight bits are "active", whereas with all bits off (so all eight one milliampere waste currents are switched into waste current conductor 25 instead of the ladder network), the voltage across the metal resistance is zero, since in this case essentially no current flows through the metal resistance.

In contrast, for the "shared node" technique of the present invention, the voltage variation across the same $R_M$ metal resistance is much less, since fairly equal currents flow through the $R_M$ metal resistance regardless of the value of the digital input word. Although the above described circuit of the present invention does not entirely eliminate voltage variation across the metal resistances due to bit pattern switching, it greatly reduces such voltage variation and thereby greatly reduces the previously mentioned non-linearity errors due to the $R_M$ metal resistances.

As increasingly accurate specifications are established for digital to analog converter circuits, the technique of FIG. 2 will provide a number of advantages. It will tend to make possible the use of relatively narrow metal ground conductor lines on the integrated circuit substrate, since the magnitude of $R_M$ will be less significant. Furthermore, since non-linearity errors are also due to a number of manufacturing process parameters in addition to the $R_M$ metal resistances, the tolerances of various integrated circuit processing parameters can be relaxed somewhat, thereby decreasing the cost of the manufacturing processes. For extremely high accuracy digital to analog converters having, for example, sixteen bits, the significance of the linearity errors due to the $R_M$ metal resistances is great.

Where such high accuracy is needed, the ability to decrease the magnitude of the voltage variations across the $R_M$ metal resistances due to bit pattern switching using the above shared node technique is very significant. However, the advantages of the technique are not attained without any disadvantages. The main disadvantages will become apparent after the topographical layout of the circuit using the shared node technique is explained.

Referring now to FIG. 3, it is seen that ground conductor 41 is an aluminum metal strip on integrated circuit substrate 74. The locations of the $R_M$ metal resistances 43-1, 43-2, and 43-3 are indicated. The locations of shared nodes 45-1, 45-2, and 45-3 are also generally indicated. Bit current transistor 60-2 is disposed in a single isolated N type region 76 which extends beneath ground conductor 41 to an L-shaped section of metalization designated by reference numeral 51. This L-shaped section of metalization corresponds to node 51 in FIG. 1. Similarly, bit current transistor 60-3 is disposed in an elongated isolated N type region that extends beneath ground conductor 41 to metalization 52, which corresponds to node 52 in the circuit schematic diagram of FIG. 2.

Reference numerals 60-2E, 60-2B and 60-2C, respectively, designate the emitter, base and collector of NPN bit current transistor 60-2. Reference numeral 76' designates a heavily doped N+ type "buried layer" region disposed along a bottom of collector region 60-2C to a point beneath the oxide opening 78 through which metalization 51 contacts collector region 60-2C.

Similarly, reference numeral 80 designates a N+ type buried layer extending from along the bottom of a collector region 61-2C of a waste current transistor 61-2 from beneath its P type base region 61-2B to the oxide opening 82 through which shared node 45-2 of ground conductor 41 contacts the collector region 61-2C of waste current transistor 61-2.

Reference numeral 47-2 designates two strips of nichrome metal interconnected by a piece of metalization 84. The two rectangular pieces of nichrome metal constitute a resistance having a value 2R. Nichrome resistor 48-2 extends between metalization 51 and metalization 52.

Although the integrated circuit topography shown in FIG. 3 is not as efficient as the previously described layout structure in which all of the NPN waste current transistors are fabricated in a single isolated N-type region, the above layout topography nevertheless is quite efficient in some cases. One thing that makes this layout possible is the extended collector region 60-2C and the buried layer 76' thereof providing a relatively low resistance connection beneath ground conductor 41 to node 51.

Figure 4:
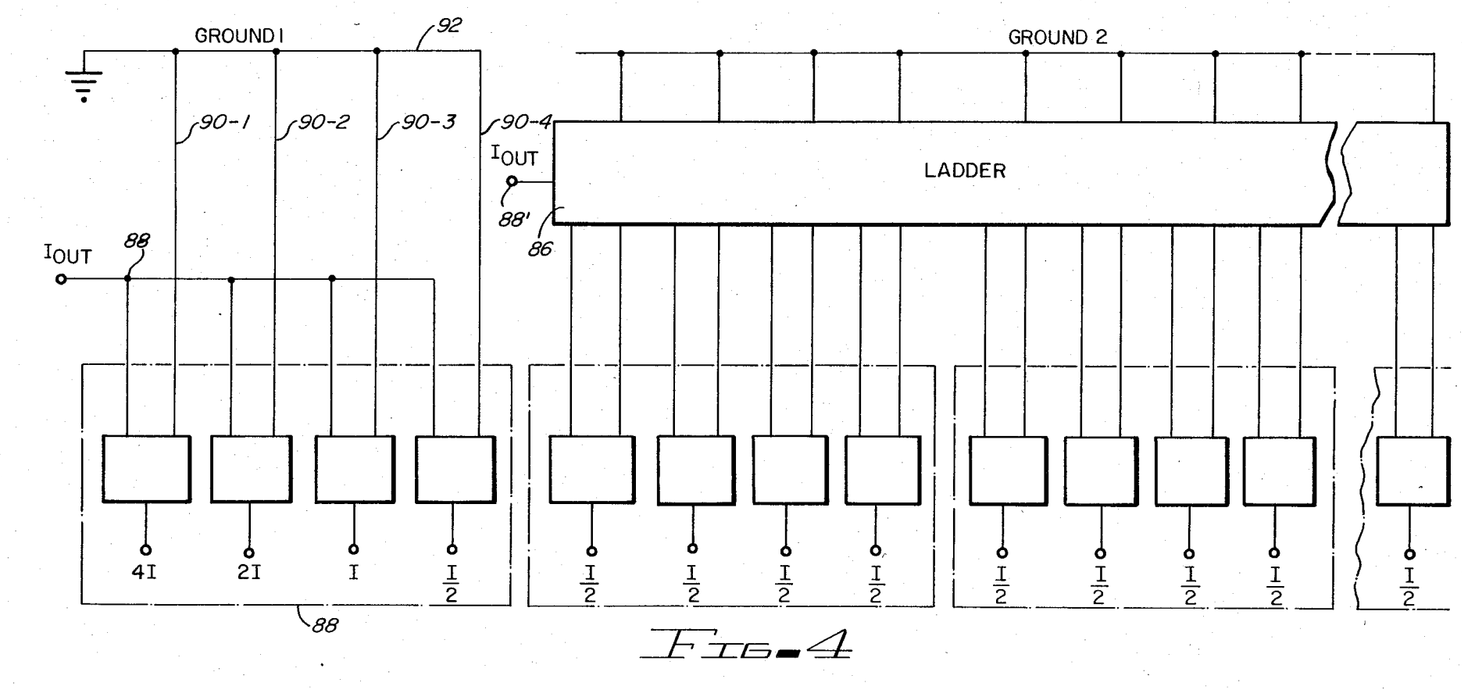
FIG. 4 is a block diagram of an alternate embodiment of the invention.

The circuit shown in FIG. 4 illustrates a composite digital to analog converter circuit including a portion comprising a predetermined number of less significant bits which utilize an R/2R resistor ladder network 86 to accomplish binary scaling of equal bit current contributions from the less significant bit switches, wherein the shared node technique for dumping waste current is utilized to provide relatively small linearity errors as a result of less significant bit pattern variation, however, the four most significant bits, generally designated by reference numeral 88 in FIG. 4, utilize binary weighting of the constant current sources themselves. More specifically, the constant source currents of the four most significant bits flow directly into the $I_{OUT}$ conductor 88, and the waste currents for the four most significant bits of the digital to analog converter shown in FIG. 4 flow through conductors 90-1, 90-2, 90-3, and 90-4 directly into ground conductor 92. Ultimately, the two output current conductors 88 and 88' are coupled together to produce a total analog output current that represents the entire digital word input, including all significant bits thereof.

While the invention has been described with reference to several particular embodiments thereof, those skilled in the art will be able to make various modifications to the disclosed circuitry and technique without departing from the true spirit and scope of the invention. It is intended that all equivalent circuit structures and methods which accomplish substantially the same function in substantially the same way to produce substantially the same result are to be encompassed within the scope of the invention. For example, the bipolar transistors could be replaced by field effect transistors or other switching means. Although the described digital to analog conversion circuitry has been shown standing alone, it could, of course, by included in an analog to digital converter in the usual manner.

We claim:

1. In a circuit for converting a multiple bit digital word to an analog current corresponding to a-digital number represented by said digital word, a bit circuit comprising in combination:
    (a) first current source means for producing a first current;
    (b) a first resistor having first and second terminals;
    (c) a second resistor having first and second terminals;
    (d) a first transistor having a collector, a base responsive to a first bit of said digital word, and an emitter;
    (e) a second transistor having a collector, a base having a first reference voltage thereon, and an emitter;
    (f) a reference current conductor having a shared node and a distributed resistance on one side of said shared node, said reference current conductor having a second reference voltage thereon;
    (g) means for coupling said first terminal of said first resistor and said collector of said second transistor to said shared node;
    (h) means for coupling said second terminal of said first resistor and said first terminal of said second resistor to said collector of said first transistor and means for resistively coupling said collector of said first transistor to an output conductor for conducting said analog current; and
    (i) means for coupling said first current source means to said emitters of said first and second transistors, said first transistor being responsive to the logic state of said first bit to steer said first current into circuitry including said first and second resistors in order to cause said first current to contribute to said analog current if said first bit is at a first logic level, said first transistor also operating to steer said first current through said second transistor, said shared node, and said distributed resistance if said first bit is at a second logic level, whereby all or at least a substantial portion of said first current flows through said distributed resistance regardless of the logic state of said first bit.

2. The circuit of claim 1 wherein the resistance of said first resistor is approximately twice the resistance of said second resistor.

3. The circuit of claim 1 wherein said circuit includes a plurality of other bit circuits that are substantially similar to said bit circuit, each of said other bit circuits including a first resistor and a second resistor, said first resistors and second resistors being coupled together to form an R/2R ladder network.

4. The circuit of claim 3 wherein said circuit is an integrated circuit formed on a substrate, said first reference current conductor including a metalization strip disposed on said substrate.

5. The circuit of claim 4 wherein said first and second transistors are NPN transistors.

6. The circuit of claim 5 wherein each of said other bit circuits includes a first transistor and a second transistor, each being an NPN transistor, and wherein each of said second transistors is formed in a respective electrically isolated N-type region which functions as the collector of that transistor.

7. The circuit of claim 6 wherein each of said first transistors is a bit current transistor.

8. The circuit of claim 7 wherein each of said first resistors and each of said second resistors is composed of nichrome, and wherein each of said first resistors and each of said second resistors is disposed on said substrate on one side of said reference current conductor, and wherein a portion of the collector region of said first transistor extends beneath said first reference voltage conductor to make electrical contact to the network including said first resistors and said second resistors and wherein a portion of the collector region of said second transistor extends beneath said first reference current conductor to make electrical contact to said shared node thereof.

9. The circuit of claim 1 wherein said circuit includes a most significant bit circuit, said most significant bit circuit including a binarily scaled constant current source and switchable current steering means responsive to the logic state of the most significant bit of said digital word for steering said binarily scaled constant current into a summation point from which said analog current flows if said most significant bit has one logical state and for steering said binarily scaled constant current into another reference current conductor if said most significant bit has another logical state.

10. A method of converting a digital input word to an analog current that represents the value of said digital input word, said method comprising the steps of:
(a) producing a first constant current;
(b) switching said first constant current through a first transistor in response to a first logical state of a first bit of said digital input word in order to produce a first bit current;
(c) conducting said first bit current into a resistive ladder network to binarily scale the contribution of said first bit current to said analog current, said ladder network including a first resistor;
(d) conducting a portion of said first bit current through said first resistor and through a shared node at which said first resistor is connected to a metal reference current conductor;
(e) conducting said portion of said first bit current through the resistance of said metal reference current conductor to a main connection point at which said metal reference current conductor is connected to a main reference current conductor;
(f) switching said first constant current through a second transistor in response to a second logical state of said first bit of said digital input word in order to produce a first waste current; and
(g) conducting said first waste current directly through said shared node and said resistance of said metal reference current conductor to said main connection point, whereby substantial amounts of current flow through said resistance of said metal reference current conductor to said main connection point regardless of whether said first bit is at a said first logical state or said second logical state.

11. The method of claim 10 wherein steps (a) through (g) are performed in a first bit circuit that corresponds to said first bit, said method including performing steps analogous to steps (a) through (g) in each of a plurality of additional bit circuits that respectively correspond to a plurality of additional bits of said digital input word in order to binarily scale the respective contributions of the resulting additional bit currents to said analog output current.

12. The method of claim 11 including:
(a) producing a second constant current; and
(b) switching said second constant current through a third transistor into a summation node from which said analog current flows in response to one logical state of a most significant bit of said digital input word and switching said second constant current through a fourth transistor into another metal reference eurrent conductor in response to another logical state of said most significant bit, said metal reference current conductor and said other metal reference current conductor having substantially the same reference voltage applied thereto.

13. A circuit for converting a digital input word to an analog output current that represents the value of said digital input word, said circuit comprising in combination:
(a) means for producing a first constant current;
(b) means responsive to a first logical state of a first bit of said digital input word for switching said first constant current through a first transistor to produce a first bit current;
(c) means for conducting said first bit current into a resistive ladder network to binarily scale a contribution of said first bit current to said analog output current, said ladder network including a first resistor;
(d) means for causing conducting of a first portion of said first bit current through said first resistor and through a shared node at which said first resistor is connected to a metal reference current conductor;
(e) means for causing conducting of said first portion of said first bit current through the resistance of said metal reference current conductor to a main connection point at which said metal reference current conductor is connected to a main reference current conductor;

(f) means responsive to a second logical state of said first bit for switching said first constant current through a second transistor in order to produce a first waste current; and (g) means for causing conducting of said first waste current directly through said shared node and through said resistance of said metal preference current conductor to said main connection point.

* * * * *